(12) United States Patent
Huang et al.

(10) Patent No.: US 7,655,930 B2
(45) Date of Patent: Feb. 2, 2010

(54) ION SOURCE ARC CHAMBER SEAL

(75) Inventors: Yongzhang Huang, Hamilton, MA (US); Neil K Colvin, Merrimack, NH (US); Kevin J Hoyt, Sandown, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 343 days.

(21) Appl. No.: 11/689,769

(22) Filed: Mar. 22, 2007

(65) Prior Publication Data

US 2008/0230713 A1 Sep. 25, 2008

(51) Int. Cl.
*H01J 37/08* (2006.01)
*H01J 7/24* (2006.01)

(52) U.S. Cl. .............................. 250/492.21; 250/423 R; 250/426; 250/427

(58) Field of Classification Search ........................ None
See application file for complete search history.

(56) References Cited

U.S. PATENT DOCUMENTS

| | | | |
|---|---|---|---|
| 5,497,006 A | 3/1996 | Sferlazzo et al. | |
| 5,703,372 A * | 12/1997 | Horsky et al. | 250/423 R |
| 5,763,890 A | 6/1998 | Cloutier et al. | |
| 5,892,232 A * | 4/1999 | Tsai et al. | 250/426 |
| 5,898,172 A * | 4/1999 | Masui et al. | 250/239 |
| 6,517,913 B1 * | 2/2003 | Cheung et al. | 427/588 |
| 6,750,600 B2 * | 6/2004 | Kaufman et al. | 313/361.1 |
| 6,777,686 B2 * | 8/2004 | Olson et al. | 250/423 R |
| 6,847,043 B2 | 1/2005 | Murrell et al. | |
| 7,102,139 B2 * | 9/2006 | Low et al. | 250/426 |
| 7,116,054 B2 * | 10/2006 | Zhurin | 315/111.41 |
| 7,276,847 B2 * | 10/2007 | Olson et al. | 313/446 |
| 7,365,339 B2 * | 4/2008 | Fujita et al. | 250/423 R |
| 7,435,971 B2 * | 10/2008 | Vanderberg et al. | 250/423 R |
| 7,446,326 B2 * | 11/2008 | Chaney et al. | 250/492.21 |

* cited by examiner

*Primary Examiner*—David A Vanore
(74) *Attorney, Agent, or Firm*—Tarolli, Sundheim, Covell & Tummino LLP

(57) ABSTRACT

An exemplary ion source for creating a stream of ions has a chamber body that at least partially bounds an ionization region of the arc chamber. The arc chamber body is used with a hot filament arc chamber housing that either directly or indirectly heats a cathode to sufficient temperature to cause electrons to stream through the ionization region of the arc chamber. A seals has a ceramic body having an outer wall that abuts the arc chamber body along a circumferential outer lip. The seal also has one or more radially inner channels bounded by one or more inner walls spaced inwardly from the outer wall.

14 Claims, 5 Drawing Sheets

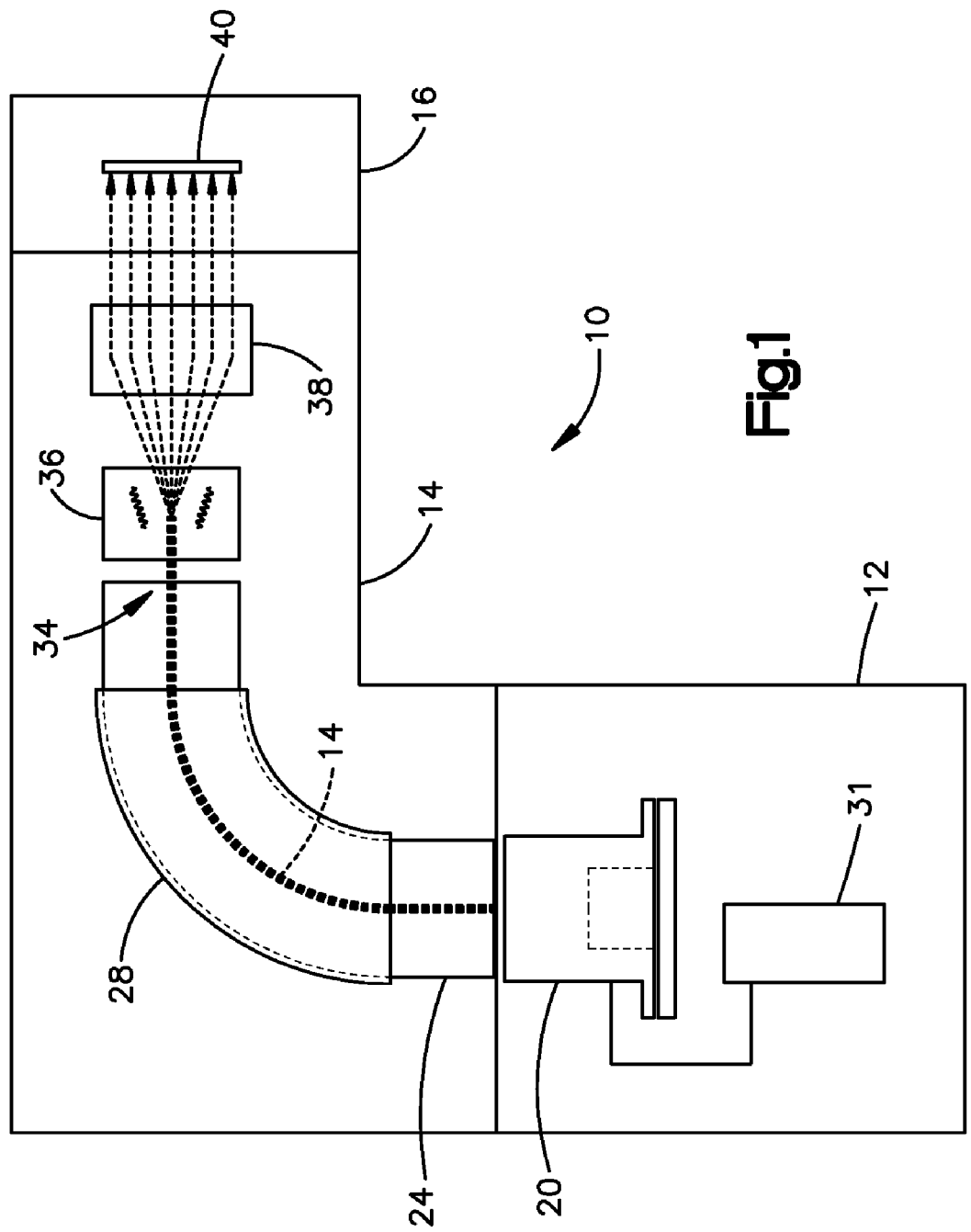

ION SOURCE ARC CHAMBER SEAL

FIELD OF THE INVENTION

The present invention relates to an ion implanter having an ion generating source that emits ions to form an ion beam for beam treatment of a workpiece.

BACKGROUND ART

Ion implanters can be used to treat silicon wafers by bombardment of the wafers with an ion beam. One use of such beam treatment is to selectively dope the wafers with impurities of controlled concentration to yield a semiconductor material during fabrication of an integrated circuits.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes that energize and direct the flow of ions from the source. The desired ions are separated from byproducts of the ion source in a mass analysis device, typically a magnetic dipole performing mass dispersion of the extracted ion beam. The beam transport device, typically a vacuum system containing an optical train of focusing devices transports the ion beam to the wafer processing device while maintaining desired optical properties of the ion beam. Finally, semiconductor wafers are implanted in the wafer processing device.

Batch ion implanters include a spinning disk support for moving multiple silicon wafers through the ion beam. The ion beam impacts the wafer surface as the support rotates the wafers through the ion beam.

Serial implanters treat one wafer at a time. The wafers are supported in a cassette and are withdrawn one at time and placed on a support. The wafer is then oriented in an implantation orientation so that the ion beam strikes the single wafer. These serial implanters use beam shaping electronics to deflect the beam from its initial trajectory and often are used in conjunction with co-ordinated wafer support movements to selectively dope or treat the entire wafer surface.

Ion sources that generate the ion beams used in existing implanters are typically so called arc ion sources and can include heated filament cathodes for creating ions that are shaped into an appropriate ion beam for wafer treatment. U.S. Pat. No. 5,497,006 to Sferlazzo et al concerns an ion source having a cathode supported by a base and positioned with respect to a gas confinement chamber for ejecting ionizing electrons into the gas confinement chamber. The cathode of the '006 patent is a tubular conductive body and endcap that partially extends into the gas confinement chamber. A filament is supported within the tubular body and emits electrons that heat the endcap through electron bombardment, thermionically emitting the ionizing electrons into the gas confinement chamber.

U.S. Pat. No. 5,763,890 to Cloutier et al also discloses an arc ion source for use in an ion implanter. The ion source includes a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

SUMMARY

The present disclosure concerns an arc ion source of a "hot type" or arc based "Bernas" or Freeman-type" or ihc (indirectly heated cathode) ion source.

One embodiment or the arc ion source includes an arc chamber body having a chamber interior bound by chamber walls for providing a confined region for generating ions from a source gas within the confined region and having an exit through which ions exit the arc chamber body. The arc chamber body has an access opening passing through a wall of the chamber body through which gas ionization energy is routed to the confined region.

A cathode supported in relation to the chamber interior injects ionizing electrons into the confined region with energy for ionizing gas in the chamber interior. An electrically insulating seal engages an outer surface of the arc chamber body to impede material from exiting the chamber interior through the access opening of the arc chamber body.

Further features of the present invention will become apparent to those skilled in the art to which the present invention relates from reading the following specification with reference to the accompanying drawings.

BRIEF DESCRIPTION OF THE DRAWINGS

FIG. 1 is schematic view of an ion implanter for ion beam treatment of a workpiece such as a silicon wafer mounted on a spinning support;

EXEMPLARY EMBODIMENT FOR PRACTICING THE INVENTION

Figure 3:
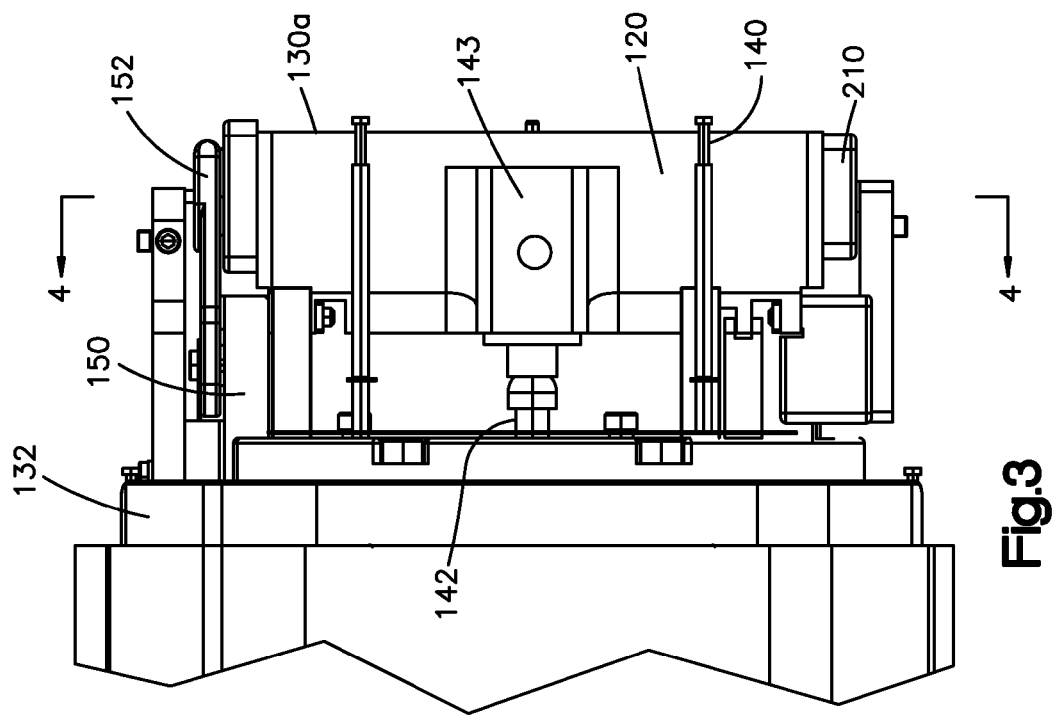
FIG. 3 is an elevation view of the ion source constructed in accordance with the invention.

Turning to the drawings, FIG. 1 is a schematic depiction of an ion beam implanter 10. The implanter includes an ion source 12 for creating ions that form an ion beam 14 which is shaped and selectively deflected to traverse a beam path to an end or implantation station 16. The implantation station includes a vacuum or implantation chamber defining an interior region in which a workpiece such as a semiconductor wafer is positioned for implantation by ions that make up the ion beam 14.

Control electronics are provided for monitoring and controlling the ion dose received by the workpiece in the implantation chamber. Operator input to the control electronics are performed via a user control console (not shown) located near the implantation station 16.

The ions in the ion beam 14 tend to diverge as the beam traverses a region between the source and the implantation chamber. To reduce this divergence, the region is maintained at low pressure by one or more vacuum pumps in fluid communication with the ion beam path.

A source assembly 20 includes a plasma arc chamber 120 (described below) defining an interior region into which source materials are injected. The source materials may include an ionizable gas or vaporized source material. Ions generated within the plasma chamber are extracted from the chamber by ion beam extraction assembly 24, which includes a number of metallic electrodes for creating an ion accelerating electric field.

Positioned along the beam path 14 is an analyzing magnet 28 which bends the ion beam 14 and directs the ions through a beam neutralizer 34. The beam neutralizer injects electrons into the beam and impedes beam blow up. Downstream form the neutralizer 34, the beam 14 passes through a deflection region 36 where ions are deflected from their initial path to form a thin or ribbon beam which impacts a workpiece.

A workpiece support 40 known as wafer clamp is seen position at the implantation station 16. A wafer is electrostatically attracted to the support as it rests horizontally and then rotates the wafer up into the ribbon beam for movement up and down with respect to that beam. The sequence of movements is such that an entire implantation surface of the workpiece is uniformly implanted with ions. A typical application treats a wafer to dope the wafer with controlled concentrations of dopant. Since the implantation chamber interior region is evacuated, workpieces must enter and exit the chamber through a load lock (not shown).

In a typical implantation operation, undoped workpieces (typically semiconductor wafers) are retrieved from one of a number of cassettes by a robot outside an evacuated chamber at the implantation station and move a workpiece into the load lock. The load lock closes and is pumped down to a desired vacuum, and then opens into the implantation chamber. The robotic arm of the chamber robot grasps the workpiece, brings it within the implantation chamber and places it on an support 40.

The electrostatic clamp is energized to hold the workpiece in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the >790 and >597 patents are incorporated herein in their respective entireties by reference.

After ion beam processing of the workpiece, the workpiece support structure returns the workpiece to a horizontal orientation and the electrostatic clamp 40 releases the workpiece. The chamber robot grasps the workpiece after such ion beam treatment and moves it from the support back into the load lock. From the load lock, a robotic arm of a robot outside the chamber moves the implanted workpieces back to one of a storage cassette and most typically to the cassette from which it was initially withdrawn. Although a serial implanter is depicted in the drawings a high current implanter which simultaneously treats multiple wafers simultaneously.

Ion Source

Figure 2:
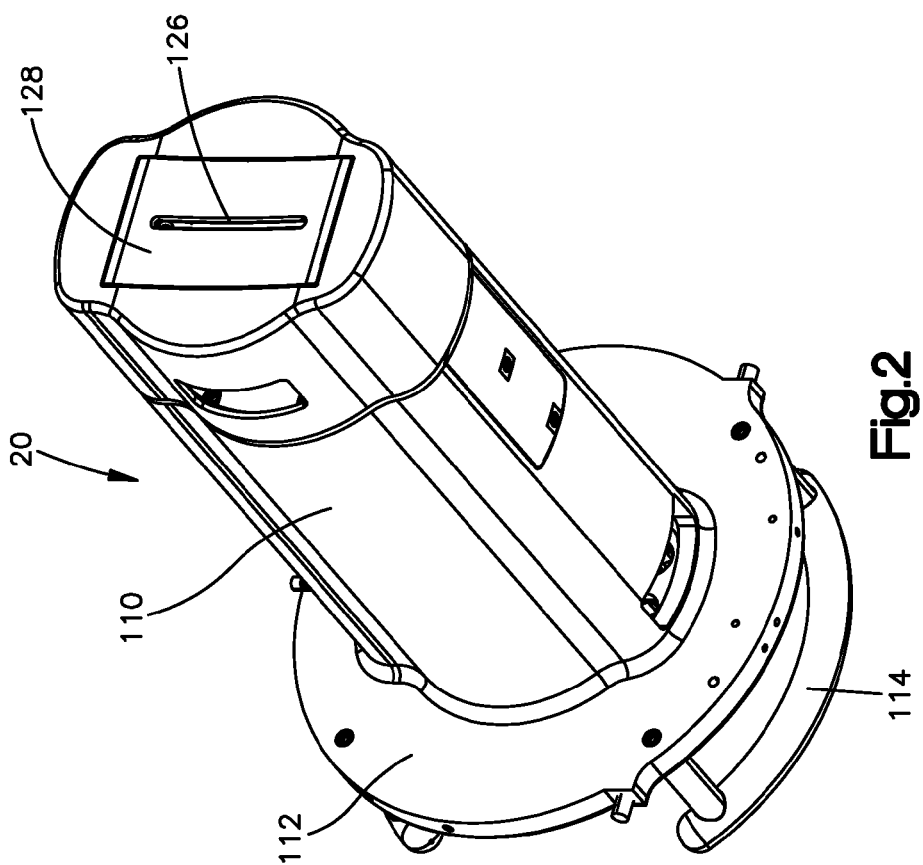
FIG. 2 is a perspective view of an ion source constructed in accordance with the invention.
Figure 4:
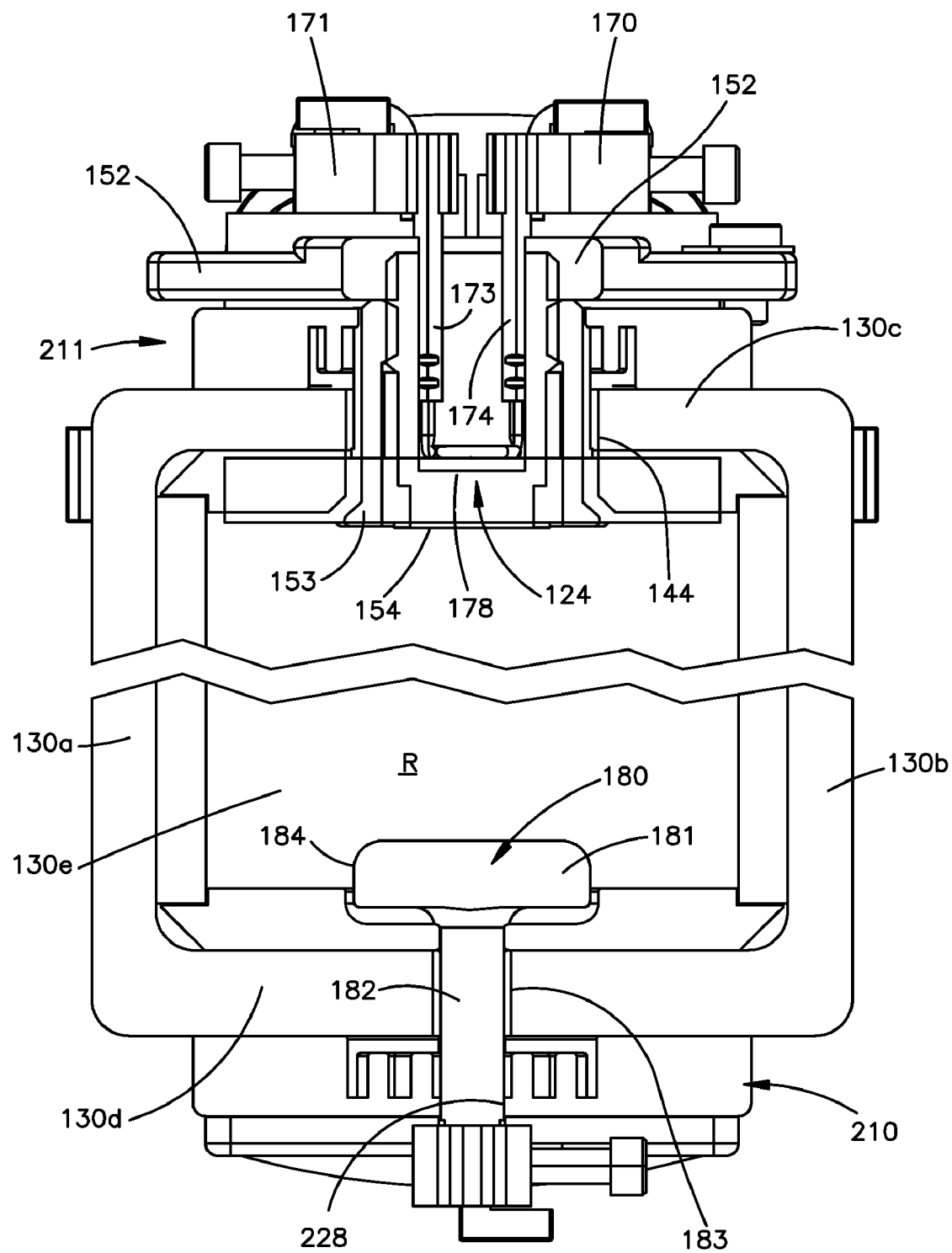
FIG. 4 is a view as seen from the plane 4-4 of FIG. 3.
Figure 5:
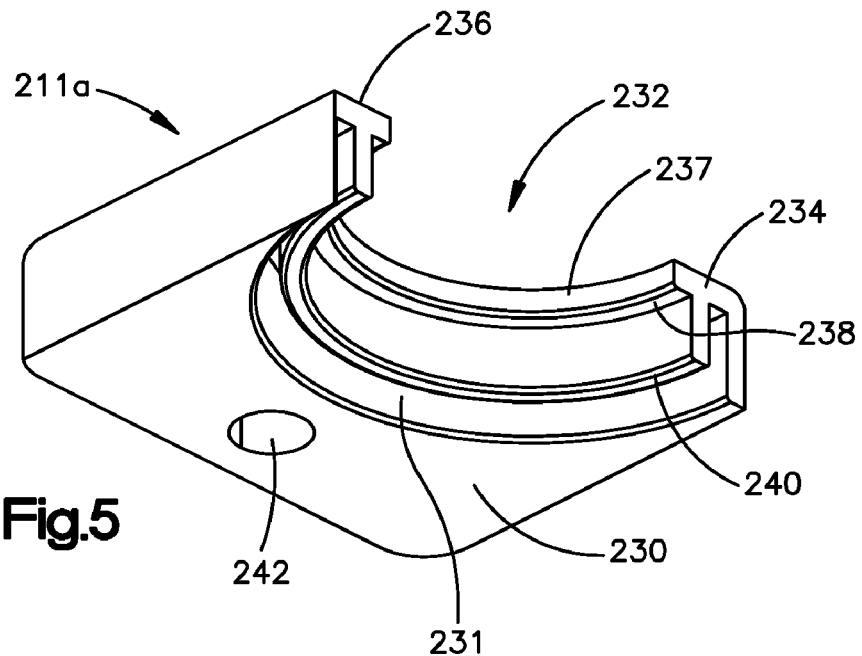
FIGS. 5 and 6 are perspective view of seals constructed in accordance with the invention.

As shown in FIG. 2, the ion generating source assembly 20 includes a source block 110 coupled to a flange 112 having handles 114 by which the source assembly 20 can be removed from the implanter. The source block 110 supports a plasma arc chamber 120 (FIG. 3) and an electron emitting cathode 124 (FIG. 4) that in the preferred embodiment of the invention is supported by the source block but electrically isolated from the arc chamber 120.

An arc ion source is defined in the textbook "Plasma Physics in Theory and Application" Ed. W. Kunkel, MacGraw-Hill, 1966 by noting that ""All [electrical] discharges with eVc<E [Vc is cathode voltage drop, E is ionization energy] will be classified as electric arcs regardless of specific conditions at the cathode or in the body of the plasma. [ . . . ] Obviously, in this way the category of arcs is very large, since no restrictions are placed on either gas pressure or current density. In fact, all thermionic diodes must be included here as long as sufficient gas ionization occurs to produce a substantial neutralization of the space charge, so that the term discharge plasma may still be appropriate. Depending on gas density, current density, and the conditions at the cathode, arc discharges can differ greatly in their characteristic properties." This definition is summarized herein by referring to a "hot filament" ion source as one where either electrons of a sufficient energy are emitted from a directly energized filament (which thus acts as a cathode) or wherein electrons from an energized filament bombard a cathode which turn emits electrons of sufficient energy to ionize a gas within an arc chamber.

An elongated, generally elliptically shaped exit aperture 126 in a plate 128 provides an exit for ions emitted from the source. Additional details concerning one prior art ion source are disclosed in U.S. Pat. No. 5,026,997 to Benveniste et al. assigned to the assignee of the present invention and which is incorporated herein by reference. As ions migrate from the arc chamber 120, they are accelerated away from the arc chamber 120 by electric fields set up by the beam extraction assembly 24 positioned relative to the exit aperture.

A source magnet (Not Shown) encircles the plasma arc chamber 120 to confine the plasma generating electrons to tightly constrained travel paths within the chamber 120. The source block 110 defines cavities that accommodate vaporizer ovens that can be filled with vaporizable solids such as arsenic that are vaporized to a gas and then injected into the plasma chamber by means of delivery nozzles.

The plasma arc chamber is an elongated metal casting which defines an interior ionization region R (FIG. 4) bounded by two elongated side walls 130a, 130b top and bottom walls 130c, 130d, a rear wall 130e, and the front plate 128. Extending outwardly near a front of the source block is a support flange 132 which supports the arc chamber 120. These walls are covered by metal liners 134 that are periodically replaced as they are eroded and or covered with source material during use.

Four pins 140 extend through openings 141 in the four corners of the flange 132 to support the plate 128 and position the exit aperture 126. Springs (not shown) bias the plate 128 into engagement with the arc chamber 120.

Vaporized material is injected into the interior of the plasma arc chamber 120 from the support block 110 by a delivery tube 142 that routes vaporized material into the chamber interior by a gas connection manifold 143 attached to the side of the arc chamber. Alternatively, gas can be directly routed into the arc chamber interior region R by means of a port or opening (not shown) in a rear wall 130e of the chamber. In such an alternate arrangement, a nozzle (not shown) abuts such an opening and injects gas directly into the arc chamber from a source or supply 31 external to the ion source.

Figure 7A:
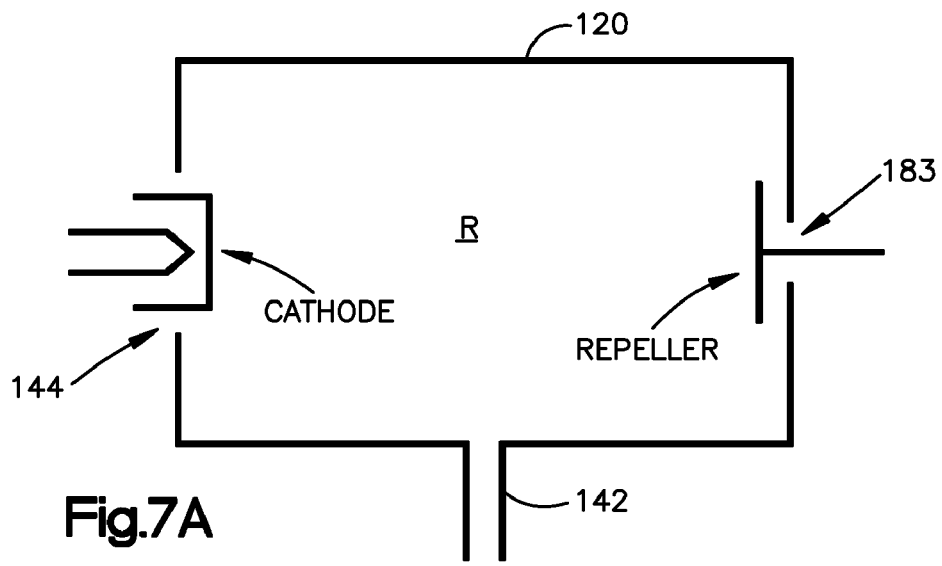
FIGS. 7A, 7B and 8 conceptually illustrate features of the invention.
Figure 7B:
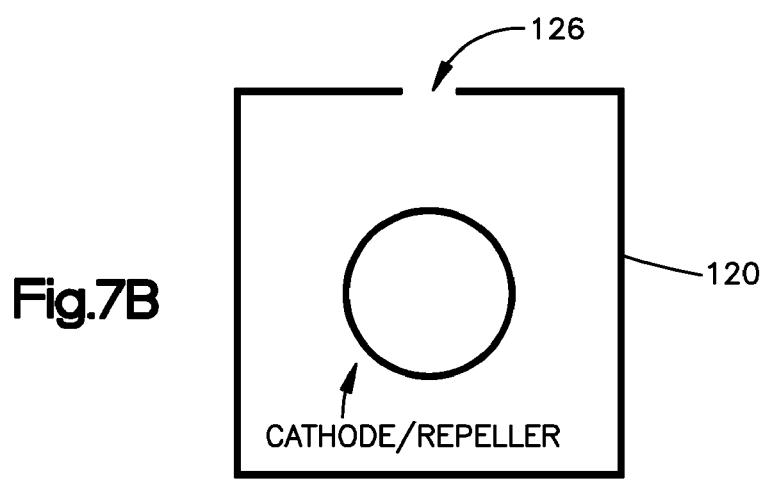
Figure 8:
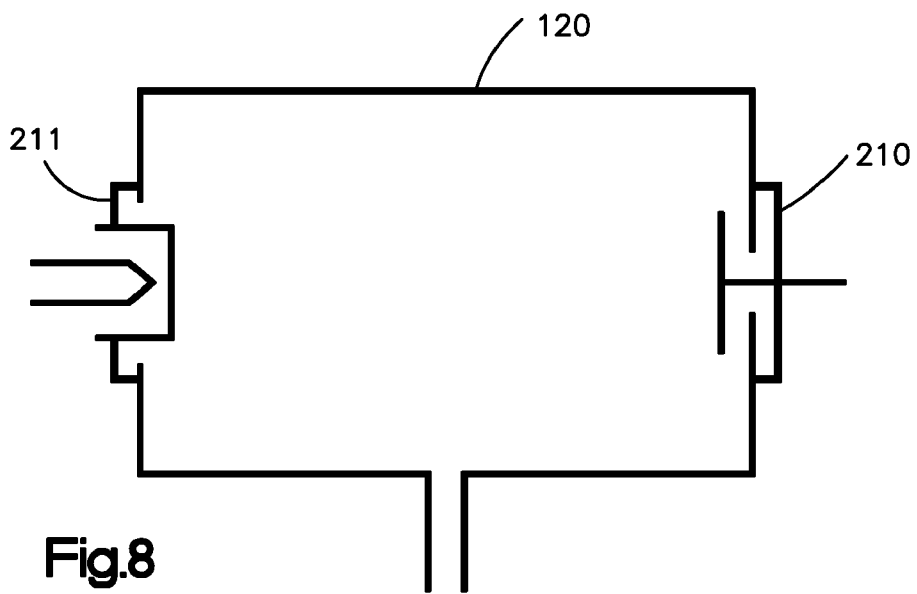

As depicted in FIGS. 7A, 7B and 8, a Bernas type of ion source has an arc chamber 120, a cathode, a repeller, and a gas inlet passageway or delivery tube 142 and an extraction opening 126 all of which require openings in a wall of the chamber. As is known in the prior art, the arc chamber has four openings to the outside. A first opening 126 is where ions can be extracted from the plasma inside the chamber. A second opening is where the source material (gas or vaporized material) is routed into the chamber through a delivery tube 142. A third opening is 144 is between the chamber and the cathode. This opening is for the thermal and electrical isolation between the chamber and the cathode. A forth opening is between the repeller and the chamber. This opening is for the electrical isolation between the repeller and the chamber.

The first opening is absolutely needed to allow ions to exit the chamber and the second opening is absolutely needed for bringing in a source material for ionization. The third and forth openings are not needed to allow entrance or exit of the source or ions so as depicted in FIG. 8, the third and the fourth openings are sealed with electrical and thermal isolation materials, for example, a ceramic 210, 211.

One advantage of sealing the third and fourth openings is to reduce the gas and plasma leakage from them, thus the gas usage can be reduced and the surrounding materials out of the arc chamber can be more cleaning.

An end wall 130c defines an opening 144 sized to allow the cathode 124 to extend into an interior of the plasma arc chamber without touching the chamber wall 130c that defines the opening 144. The cathode 124 is supported by an insulating mounting block 150 that is attached to the source block in relation to the end of the arc chamber that supports the cathode 124. A cathode body that fits into the opening 144 is mounted to a metal mounting plate 152 supported by the insulating mounting block 150. The insulating block 150 is an elongated ceramic electrically insulating block.

The generally tubular cathode has an open end that threadingly engages the mounting plate 152. A shield 153 has a threaded lower end portion that threadingly engages the outer surface of the cathode. An end cap 154 of the cathode 124 is conductive and fits within a counterbore of an end of one of the tubular cathode body. The length of the tubular member of the cathode causes the end cap 154 to extend into the arc chamber to a position approximately co-planar with the end of the shield 153.

Two conductive mounting arms 170, 171 support a filament 178 inside the cathode 124. The arms 170, 171 are attached directly to the insulating block 150 by connectors that pass through the arms to engage threaded openings in the block 150. Conductive clamps 173, 174 are coupled to the filament and energized by signals routed through electrical feedthroughs connected to the arms.

Two clamps fix a filament 178 within a cavity defined by an innermost tubular member of the cathode. The filament 178 is made of a wire bent to form a helical loop. Ends of the filament 178 are supported by legs held in electrical contact with the two arms 170, 171 by the clamps 173, 174.

When the wire filament 178 is energized by application of a potential difference across the two arms 170, 171, the filament emits electrons which accelerate toward and impact the end cap 154 of the cathode 124. When the end cap 154 is sufficiently heated by electron bombardment, it in turn emits electrons into the arc chamber. The highly energetic electrons strike gas molecules in the region R and create ions within the arc chamber. An ion plasma is created and ions within this plasma exit the opening 126 to form the ion beam. The end cap 154 shields the filament from contact with the ion plasma within the chamber and extends the life of the filament.

Electrons generated by the cathode 124 that are emitted into the arc chamber 76 but which do not engage a gas molecule within a gas ionization zone move to the vicinity of a metal repeller 180. The repeller 180 deflects electrons back into a gas ionization region R to contact a gas molecule. The repeller 180 includes a widened end cap 181 coupled to an elongated stem 182.

The stem is spaced from the wall 130d of the plasma arc chamber 120 by a gap defined by a cylindrical opening 183 having an inner diameter larger than the outer diameter of the repeller's stem 182. The cathode 124 and repeller 180 are therefore both electrically isolated from the arc chamber walls. The walls of the chamber 120 are held at a local ground or reference electric potential. The cathode, including the cathode end cap 154, is held at a potential of between 50-150 volts below the local ground of the chamber walls. This electric potential is coupled to the plate 152 by a power feedthrough for attaching an electrical conductor to the plate 152 that supports the cathode.

The filament 178 is held at a voltage of between 200 and 600 volts below that of the end cap 154. This large voltage difference between the filament and the cathode imparts a high energy to the electrons leaving the filament sufficient to heat the end cap 164 and thermionically emit electrons into the chamber 120 The repeller 180 is held at cathode potential by a conductive strap connecting both repeller and cathode to a common DC power supply (not shown). Another option is to connect the two to a separate DC power supply and set at an independent voltage level. The repeller 180 is supported by a repeller clamp mounted to a ceramic insulator.

The '006 patent to Sferlazzo et al depicts a schematic of a circuit that controls arc current between the cathode and the anode (chamber walls of the arc chamber). The operation of this circuit is described in the Sferlazzo et al patent and is also incorporated herein. During generation of ions, the source heats up due to the injection of ionizing energy into the arc chamber. Not all of this energy ionizes the gas within the arc chamber and a certain amount of heat is generated. The chamber includes water couplings that route cooling water into the source block and route heated water away from the region of the arc chamber.

Seals 210, 211

The drawings depicting the source also illustrate two ceramic seals 210, 211 made of ceramic. These seals prevent gas from being emitted from the arc chamber in the region of the repeller 180 and the cathode 124.

The seal 210 in the region of the repeller (FIG. 7) is a one piece ceramic body 212 that defines a center opening 213 sized to accommodate the support stem 182 of the repeller. A wall 214 that abuts the chamber source body surrounds a circumferential well or cavity 216. The seal 210 also defines two channels 220, 221 bounded by curved, generally cylindrical inner walls 222, 223 having generally circular edges that are slightly recessed from the plane of the wall 214. In the exemplary embodiment the edges of these walls are recessed a distance of about a few mm from the interface between the seal and the chamber wall. These walls are spaced from each by generally equal width channels that extend into the body of the seal. A ledge 226 that surrounds the central opening 213 is approximately co-planar with a bottom or base of the channels bounded by the walls 222, 223. A surface 228 radially inward from the ledge has an inner diameter only slightly larger than the outer diameter of the repeller stem so that the ledge 226 contacts the repeller stem 182 when installed. The seal 210 defines two openings 229 that accommodate two mounting connectors made from molybdenum. These connectors are most preferably bolts having heads that seat in the body of the seal and extend through the seal wherein a nut (also molybdenum) tightens over a threaded end of the bolt. These are installed before the internal liners are added to the chamber interior.

Figure 6:
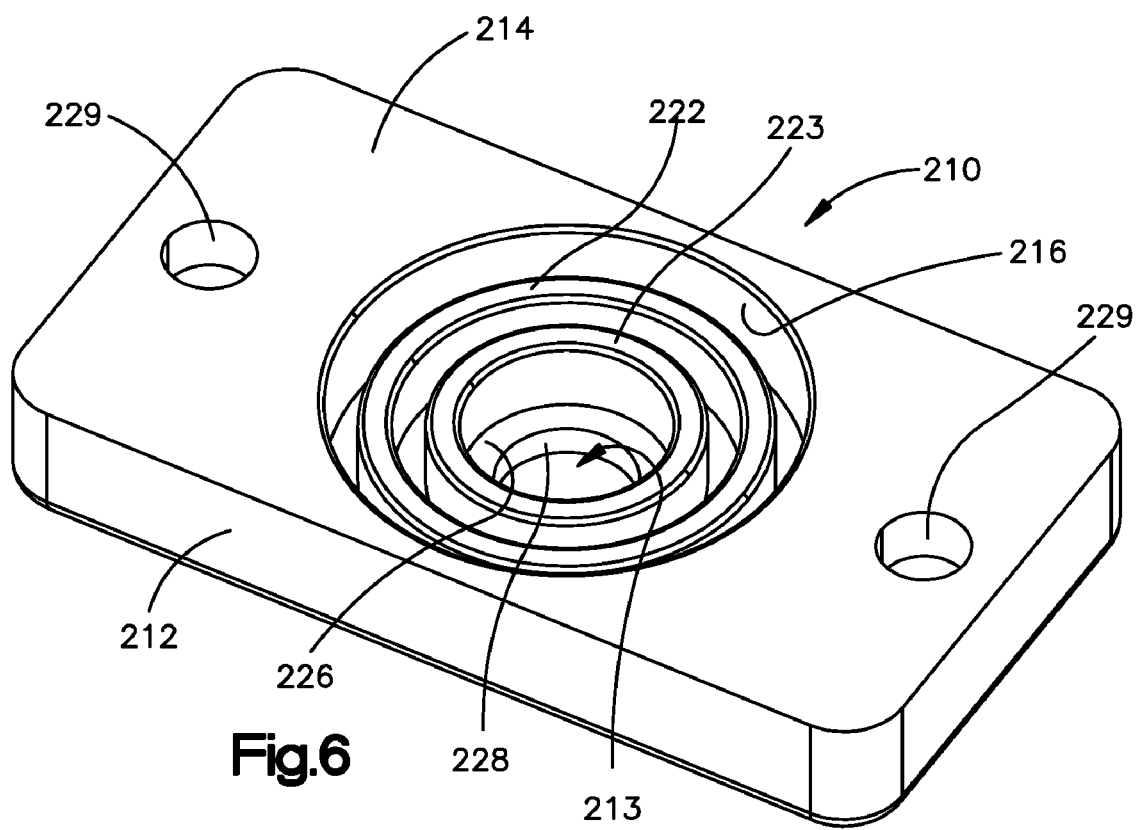

The seal 211 is a two piece ceramic body. One portion 211a of the seal 211 is depicted in FIG. 6. The seal 211 defines a larger opening 232 sized to accommodate the cathode structure. A wall 230 abuts the chamber body surrounds a circumferential well 231. The seal 211 defines a single channel bounded by a single curved, generally cylindrical inner wall 240 having a rim or edge that is slightly recessed from the plane of the wall 230. The two halves of the seal are mirror images of each other and mate along abutting surfaces 234, 236 when the seal 211 is connected to the arc source body. An innerwardly facing surface 237 of the seal 211 engages an outer surface of the cathode shield. This surface bounds a ledge 238 having the same thickness as the base of the circumferential well 231. An opening 242 extends through the seal 211 a and allows a connector to connect the seal 211 to the arcchamber body.

Surfaces of the cathode seal that are exposed to the ion plasma inside the region R of the chamber will during use become coated with sputtered carbon and molybdenum thereby electrically shoring the cathode and/or repeller to the arch chamber. The grooves defined by the inner walls 222, 223, 240 maximize a surface area so exposed to contact by the sputtered carbon and molybdenum thereby extending the service life of the respective seal.

From the above description of a preferred embodiment of the invention, those skilled in the art will perceive improvements, changes and modifications. Such improvements, changes and modifications within the skill of the art are intended to be covered by the appended claims.

The invention claimed is:

1. Apparatus comprising:
   a) an arc chamber body having a chamber interior bound by chamber walls providing a confined region for generating ions from a source gas within the confined region and having an exit through which ions exit the arc chamber body; said arc chamber body including an access opening passing through a chamber wall of the chamber body for routing ionization energy from outside the arc chamber to the chamber interior;
   b) a cathode supported in relation to the chamber interior for injecting ionizing electrons into the confined region for ionizing gas in the chamber interior when energized by energization signals entering the chamber through the access opening;
   c) an electrically insulating seal comprising a ceramic body having an exterior wall that abuts an outer surface of the arc chamber body and circumferentially bounds the access opening which passes through the chamber wall for impeding material from exiting the chamber interior through the access opening of the arc chamber body.

2. The apparatus of claim 1 wherein the arc chamber body has an additional access opening and a further comprising a repeller extending through the additional access opening into the chamber interior for prolonging electron movement within the confined region of the chamber interior by deflecting the electrons as they move through the chamber interior and further comprising an additional electrically insulating seal engaging an outer surface of the arc chamber body for impeding material from exiting the chamber interior through the additional access opening of the arc chamber body.

3. The apparatus of claim 1 wherein the seal comprises a curved wall bounding one or more inner channels spaced outwardly from a central throughpassage of the seal.

4. The apparatus of claim 3 wherein the inner channels are curved and extend around the central throughpassage.

5. The apparatus of claim 1 wherein the seal is constructed of two seal portions that mate along an engagement surface.

6. The apparatus of claim 5 wherein the seal comprises two generally symmetric half ceramic seal portions.

7. A seal for impeding gas flow from an arc chamber comprising:
   a ceramic body including i) an outer wall that includes a bounding wall having an outer surface for abutting an arc chamber body along a sealing surface and which bounds a throughpassage extending through the ceramic body for routing electrode energization signals into the arc chamber ii) an outer wall spaced from the bounding wall and iii) one or more one or more interior walls that extend away from the outer wall that define a cavity in the ceramic body having one or more channels that increase a surface area of exposed interior walls and which communicates with a portion of an arc chamber interior and collect material in the arc chamber interior.

8. The structure of claim 7 wherein the ceramic body is formed of two parts that mate along a contact surface.

9. A seal for impeding gas flow from an arc chamber comprising:
   a ceramic body including i) a bounding wall having an outer surface for abutting an arc chamber body along a sealing surface and which bounds a throughpassage extending through the ceramic body for routing electrode energization signals into the arc chamber and ii) one or more one or more cylindrical interior walls that bound a cylindrical channel or channels that define a cavity in the ceramic body and which communicates with a portion of an arc chamber interior for collecting material exiting the arc chamber interior through the throughpassage.

10. A seal for impeding gas flow from an arc chamber comprising:
    a ceramic body including i) a bounding wall having an outer surface for abutting an arc chamber body along a sealing surface and which bounds a throughpassage extending through the ceramic body for routing electrode energization signals into the arc chamber ii) an exterior wall spaced from the bounding wall and has a smaller opening in the exterior wall than a size of the throughpassage extending through the bounding wall and iii) one or more one or more interior walls that define a cavity in the ceramic body and which communicates with a portion of an arc chamber interior and collects material in the arc chamber interior.

11. The structure of claim 10 wherein the exterior wall bounds a base of the cavity and one or more interior walls extend away from the base to increase the surface area of the cavity.

12. The structure of claim 11 wherein in a region of the exterior wall the throughpassage is circular and is bound by a lip radially inward of the interior walls.

13. For use in an ion implanter, an ion source comprising:
    a) an arc chamber body for generating ions in a chamber interior having an exit for allowing ions generated inside the chamber interior to exit the arc chamber body and a cathode opening extending through a wall of the arc chamber body for positioning a cathode with respect to said chamber interior;
    b) a cathode supported in communication with the chamber interior for injecting ionizing electrons for movement through the chamber interior;
    c) a seal that contacts an outer surface of the arc chamber body and impedes material from exiting the chamber through the cathode opening in said arc chamber body comprising a ceramic body having a wall that abuts the chamber body and further defining one or more inner channels bounded by one or more inner walls recessed from an interface between the seal and the chamber body and spaced outwardly from a region occupied by the cathode.

14. For use in an ion implanter, a method for sealing an ion source comprising:

a) generating ions in a chamber interior having an exit for allowing ions generated inside the chamber interior to exit an arc chamber body;
b) supporting a cathode within a cathode opening which extends through a chamber wall bounding the chamber interior for injecting ionizing electrons for movement through the chamber interior;
c) sealing an outer surface of the arc chamber body for impeding material from exiting the chamber through said cathode opening in said arc chamber body by positioning a ceramic body having an outer wall in abutting relation to the chamber body and further spacing one or more radially inner channels bounded by one or more recessed inner walls spaced from a region occupied by a cathode support to collect material from the chamber in said channels.

* * * * *